United States Patent [19]

Uemura et al.

[11] Patent Number: 4,688,030

[45] Date of Patent: Aug. 18, 1987

[54] FLUORESCENT DISPLAY DEVICE

[75] Inventors: Sashiro Uemura; Motoo Iwade, both of Mie, Japan

[73] Assignee: ISE Electronics Corporation, Ise, Japan

[21] Appl. No.: 844,181

[22] Filed: Aug. 23, 1984

[30] Foreign Application Priority Data

Aug. 26, 1983 [JP] Japan .................. 58-155888

[51] Int. Cl.[4] ............................................. G09G 3/30
[52] U.S. Cl. ................... 340/781; 340/771; 340/772; 340/811
[58] Field of Search ............ 340/718, 719, 771, 778, 340/803, 760, 780, 772, 781, 825.88, 825.89, 811; 357/10, 19, 23, 34, 44, 45, 73; 315/169.4

[56] References Cited

U.S. PATENT DOCUMENTS

| | | | |
|---|---|---|---|
| 3,728,714 | 4/1973 | Kolesar et al. | 340/792 X |
| 3,761,617 | 9/1973 | Tsuchiya et al. | 340/781 X |
| 3,793,628 | 2/1974 | Gaur | 340/781 X |
| 3,882,355 | 5/1975 | DeWitt | 340/781 X |
| 3,913,090 | 10/1975 | Fischer | 340/781 X |
| 4,051,389 | 9/1977 | Kaneko et al. | 357/44 X |
| 4,056,810 | 11/1977 | Hart et al. | 357/44 X |
| 4,104,732 | 8/1978 | Hewlett, Jr. | 357/44 X |
| 4,112,333 | 9/1978 | Asazs et al. | 340/719 |
| 4,133,611 | 1/1979 | Baker | 357/45 X |
| 4,158,237 | 6/1979 | Wiedmann | 357/45 X |
| 4,162,427 | 7/1979 | Kamegaya | 340/772 X |
| 4,193,126 | 3/1980 | Smith | 357/45 X |
| 4,236,154 | 11/1980 | Lee | 340/805 X |
| 4,246,592 | 1/1981 | Bartlett | 357/45 X |
| 4,314,360 | 2/1982 | Higuchi et al. | 357/45 X |
| 4,315,259 | 2/1982 | McKee et al. | 340/771 X |
| 4,368,467 | 1/1983 | Unotoro et al. | 340/800 X |
| 4,400,712 | 8/1983 | O'Connor | 357/44 |
| 4,480,319 | 10/1984 | Hotta et al. | 357/44 X |
| 4,486,749 | 12/1984 | Kishino et al. | 340/772 |
| 4,540,983 | 9/1985 | Morimoto et al. | 340/772 |
| 4,562,453 | 12/1985 | Noguchi et al. | 357/42 X |

FOREIGN PATENT DOCUMENTS 53-141570 12/1978 Japan .
56-24993 6/1981 Japan .
57-99688 6/1982 Japan .

Primary Examiner—Gerald L. Brigance
Attorney, Agent, or Firm—Blakely, Sokoloff, Taylor & Zafman

[57] ABSTRACT

In a fluorescent display device, a light-emitting display section and a drive section for controlling the light-emitting display section are formed on a single semiconductor substrate to constitute an integrated semiconductor substrate, and the integrated semiconductor substrate and a cathode opposing a surface of the integrated semiconductor substrate which has the light-emitting display section thereon are hermetically sealed in a vacuum chamber having at least one light-transmitting surface. The light-emitting display section has a plurality of light-emitting elements in a matrix form. Each of the light-emitting elements is constituted by a static random access memory of a flip-flop and a drive transistor, a first terminal of which is connected to one of Q and $\overline{Q}$ output terminals of the flip-flop, a second terminal of which is connected to a phosphor screen electrode, and a third terminal of which is connected to a power source line.

10 Claims, 6 Drawing Figures

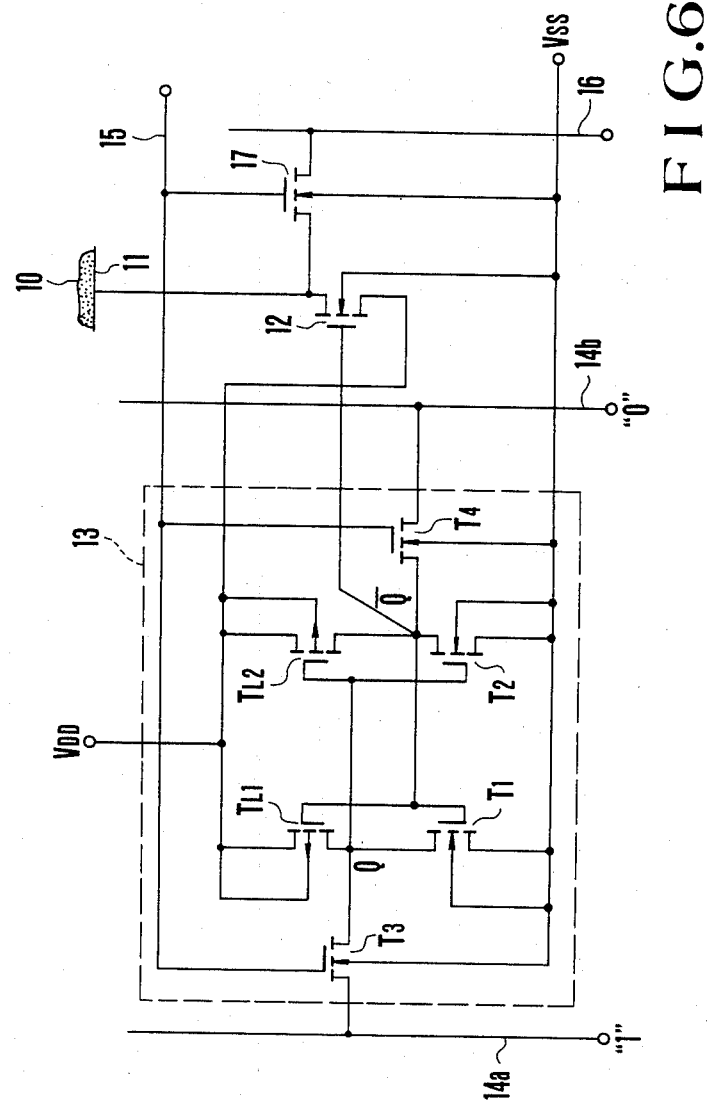

4,688,030

FLUORESCENT DISPLAY DEVICE

BACKGROUND OF THE INVENTION

The present invention relates to a fluorescent display device for displaying characters and symbols by utilizing fluorescence and, more particularly, to a fluorescent display device having a light-emitting display section having light-emitting elements in a matrix form.

A conventional fluorescent character display tube is described in Japanese Patent Disclosure No. 53-141570 wherein grids of a predetermined number of characters and a plurality of phosphor dots in a matrix (e.g., $5 \times 7$ dots) are arranged so as to oppose the grids, and time-division pulses are sequentially applied to the grids to display characters and symbols.

However, in a fluorescent character display tube of this type, the number of dots is increased in accordance with a variety of display characters, and the number of lead wires connected to the fluorescent character display tube is increased in accordance with an increase in the number of characters to be displayed (i.e., grids). The wiring operation becomes complicated in accordance with the increases described above, and thus the number of drive elements for driving the grids and the phosphor dots is increased, resulting in high cost. In addition, since the grids are sequentially driven in response to the time-division pulses, the duty factor is decreased in accordance with an increase in the number of characters (i.e., grids), and a drive voltage required for the necessary luminance is raised. As a result, expensive elements having a high dielectric withstand voltage must be used. In addition to this disadvantage, drive elements are not often easily accessible.

In addition to the above-mentioned fluorescent display tube, other types of fluorescent display tubes have been proposed which perform graphic display, as described in Japanese Patent Publication No. 56-24993 and Japanese Patent Disclosure No. 57-99688. Each of these fluorescent display devices comprises a display unit obtained such that MOSFET switching elements, fluorescent screen electrodes connected to the MOSFET switching elements, a memory including capacitors, and a shift register for driving the switching elements are formed on a single semiconductor substrate.

The display device of the type described above can be effectively operated even if the number of lead wires connected to the fluorescent display tube is increased. However, the memory comprises a dynamic memory of capacitors, so the number of times of refreshing must be increased to perform high-luminance display. In other words, a high-frequency signal must be used. In particular, when the number of display elements is increased, a required number of times of refreshing cannot be performed, and so luminance is degraded, resulting in flickering on the phosphor screen.

SUMMARY OF THE INVENTION

It is an object of the present invention to provide a fluorescent display device wherein the number of lead wires connected to a fluorescent display tube is small, memory refreshing need not be performed, and high-luminance display can be obtained with a low voltage.

In order to achieve the above object of the present invention, there is provided a fluorescent display device comprising a light-emitting display section and a drive section which are formed on a single semiconductor substrate, the light-emitting display section having a plurality of light-emitting elements arranged in a matrix form, each of the light-emitting elements being constituted by a flip-flop static RAM (random access memory) (to be referred to as an S-RAM for brevity hereinafter) and a switching transistor selectively connected to a Q or $\overline{Q}$ output terminal of the S-RAM so as to switch a voltage to be applied to a phosphor screen electrode.

BRIEF DESCRIPTION OF THE DRAWINGS

FIGS. 2 to 6 are respectively circuit diagrams showing examples each of which is one light-emitting element.

DETAILED DESCRIPTION OF THE PREFERRED EMBODIMENT

The present invention will be described in detail with reference to a preferred embodiment taken in conjunction with the accompanying drawings.

Figure 1:
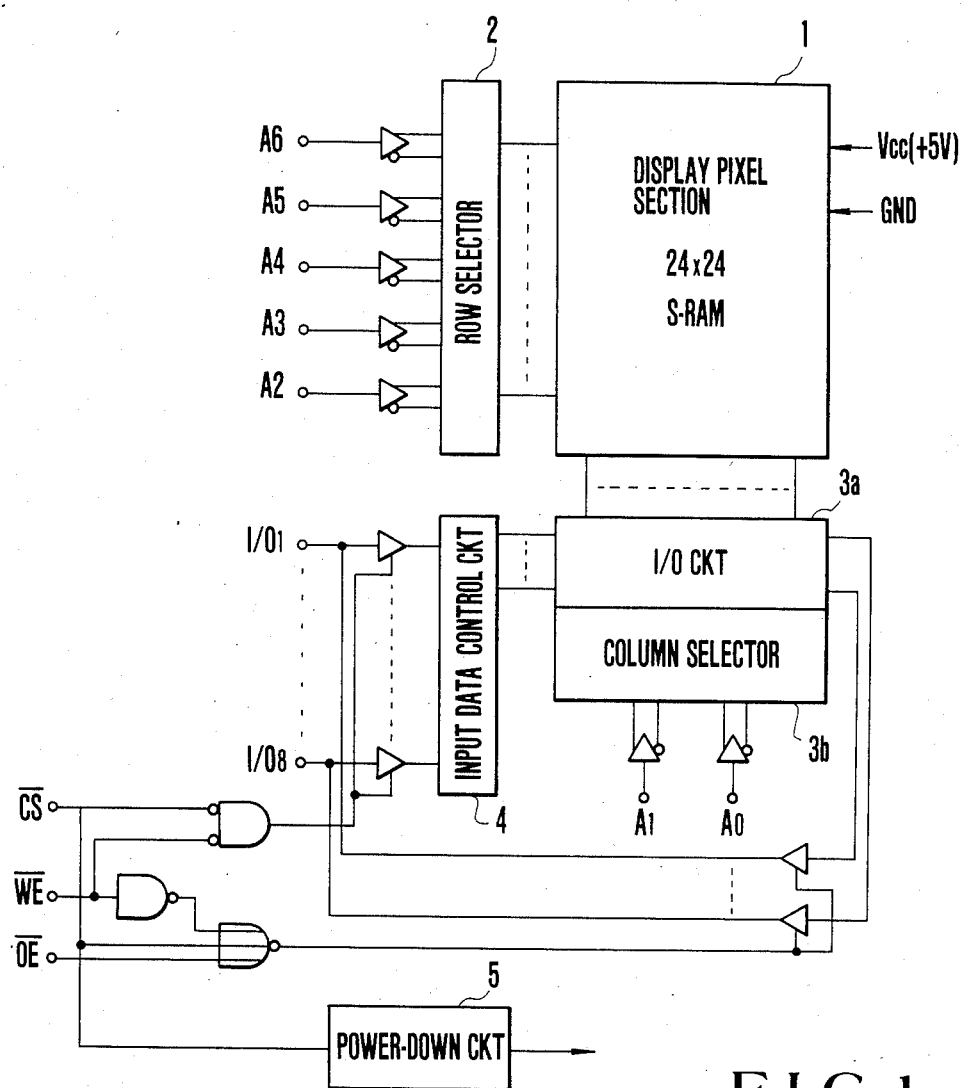
FIG. 1 is a block diagram of a fluorescent display device having a light-emitting display section and a drive circuit which are formed on a single semiconductor substrate according to an embodiment of the present invention.

FIG. 1 shows a fluorescent display device for displaying kanji characters in a $24 \times 24$ light-emitting dot matrix according to an embodiment of the present invention. The circuit of this fluorescent display device is integrated on a single semiconductor substrate. A plurality of integrated semiconductor substrates corresponding to the number of display characters are juxtaposed on an insulating substrate such as a glass substrate, and filament cathodes are arranged to oppose display pixels. A transparent cover is covered above the filament cathodes and is bonded to the insulating substrate to hermetically seal the integrated semiconductor substrates. Thereafter, the interior of the resultant structure is evacuated, thereby obtaining a fluorescent display device. A grid electrode may be arranged between the filament cathodes and the display pixels to cover all of the display pixels.

Referring to FIG. 1, reference numeral 1 denotes a display pixel section; 2, a row selector serving as a driver for driving the display pixel section 1; 3a, an input/output (I/O) circuit; 3b, a column selector; 4, an input data control circuit; and 5, a power-down circuit. The components excluding the display pixel section 1 are the same as those used for a conventional S-RAM. Terminals A0 to A6, I/O1 to I/O8, WE and OE of the integrated semiconductor substrates of the respective display characters are commonly connected and are led outside the display tube. The number of terminals CS is determined in accordance with the number of display characters of each of the integrated semiconductor substrates.

The arrangements of one light-emitting element constituting the display pixel section 1 will be described hereinafter.

Figure 2:
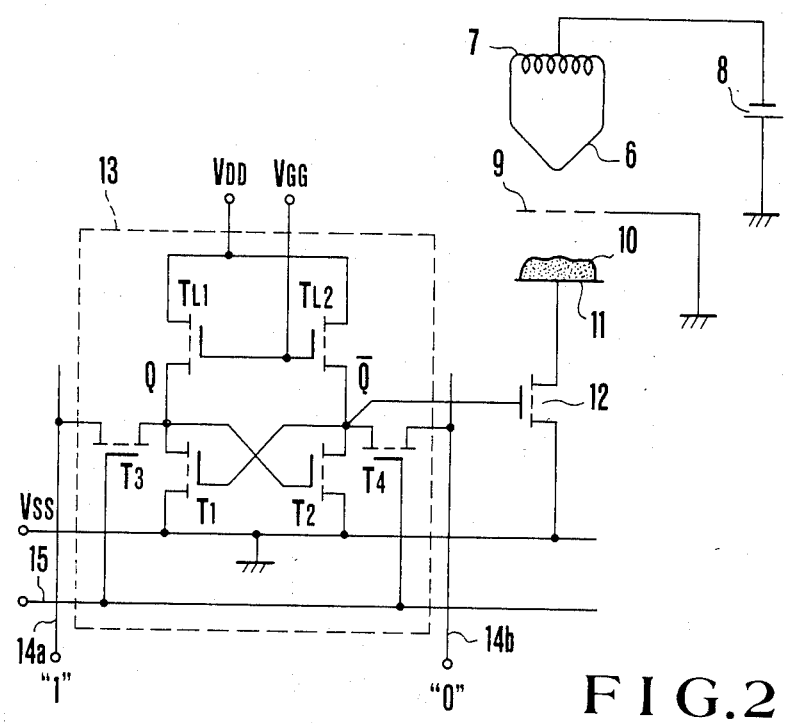

FIG. 2 shows an arrangement wherein a C-MOS substrate is used and a P-MOS transistor is used as a drive transistor. A filament cathode 6 is connected across a filament power source 7. The filament power source 7 is connected to a fluorescent display tube drive power source 8. A grid 9 is inserted between the filament cathode 6 and a phosphor 10. The phosphor 10 is formed on a light-emitting electrode (anode) 11 constituting a phosphor screen. The first terminal of a drive transistor 12 is connected to a $\overline{Q}$ output terminal of a flip-flop constituting an S-RAM 13. The second and third terminals of the drive transistor 12 are connected to the light-emitting electrode 11 and a VSS power source line. A bit line 14a of logic "1" and a bit line 14b of logic "0" are connected to the column selector 3b (FIG. 1). The bit lines 14a of the respective light-emitting elements are commonly connected. Similarly, the bit lines 14b of the respective light-emitting elements are also commonly connected. A word selection line 15 is connected to the row selector 2 (FIG. 1). The word selection lines 15 are commonly connected in units of rows and are connected to the row selector 2. The S-RAM 13s comprise transistors TL1, TL2 and T1 to T4.

In the display pixel section 1 having the light-emitting element of the arrangement described above, when light-emitting or nonemitting signals are selectively supplied to the elements and are stored in the corresponding S-RAMS 13 by using a combination of the bit lines 14a or 14b and the word selection lines 15, the corresponding drive transistors 12 are switched in response to voltage signals at the $\overline{Q}$ output terminals of the S-RAMs 13, so that the voltages from the fluorescent display tube drive power sources 8 are applied to the corresponding phosphors 10 through the corresponding light-emitting electrodes 11. As a result, thermoelectrons emitted from the filament 6 heated by the filament power source 7 are accelerated and diffused by the grid 9 and then in cooperation with an acceleration voltage from the drive power sources 8, bombarded against the corresponding phosphor 10, thereby allowing the phosphor to emit light. The phosphor 10 which starts emitting light continues to emit light in accordance with the data stored in the S-RAM 13 until the nonemitting signal is supplied thereto through the bit lines 14a and 14b and the word selection line 15. Therefore, memory refreshing need not be performed, and high-luminance and flicker-free display can be performed at a low voltage because a DC voltage is applied to the phosphor 10. As previously described, the grid 9 can be arranged as needed.

Figure 3:
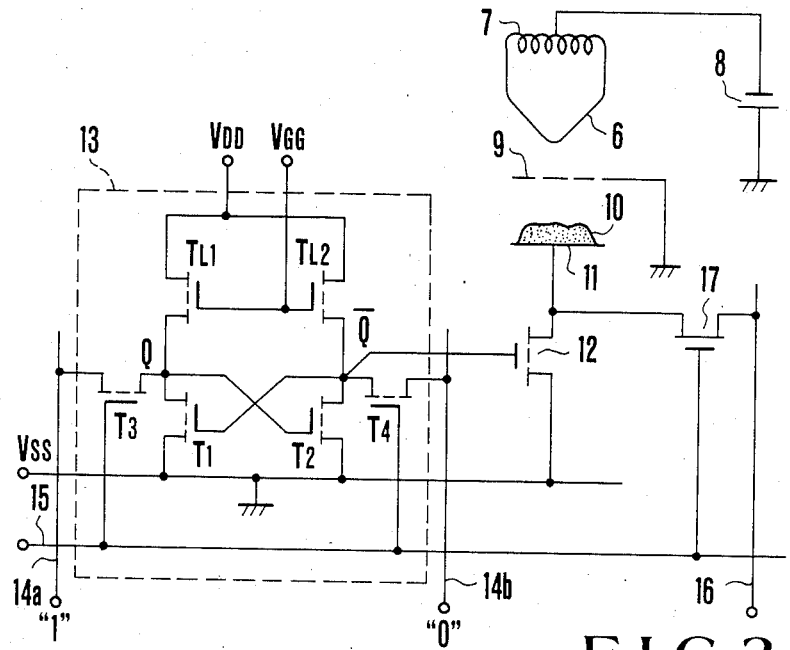

FIG. 3 shows another arrangement of the light-emitting element. A C-MOS substrate is used as the integrated semiconductor substrate, and a P-MOS is used as a drive transistor 12 in the same manner as in FIG. 2. The same reference numerals used in FIG. 3 denote the same parts as in FIG. 2. The arrangement in FIG. 3 is substantially the same as that in FIG. 2, except that a read transistor 17 is added such that a first terminal is connected to a word selection line 15, a second terminal is connected to a light-emitting electrode 11 and a third terminal is connected to a read line 16, and that the read lines 16 are commonly connected to a column selector 3b in units of columns.

The basic light-emitting/display mechanism of the arrangement shown in FIG. 3 is the same as that in FIG. 2. However, test signals are sequentially applied to the word selection lines 15 to read out data from S-RAMs 13 through the corresponding read lines 16. The integrated semiconductor substrates can be checked independently of other components, and thus defective substrates can be discriminated in the fabrication process of the display devices. The read line 16 can also serve as a signal line for transferring to another device a signal representing a light-emitting state while the fluorescent display device is being operated.

Figure 4:
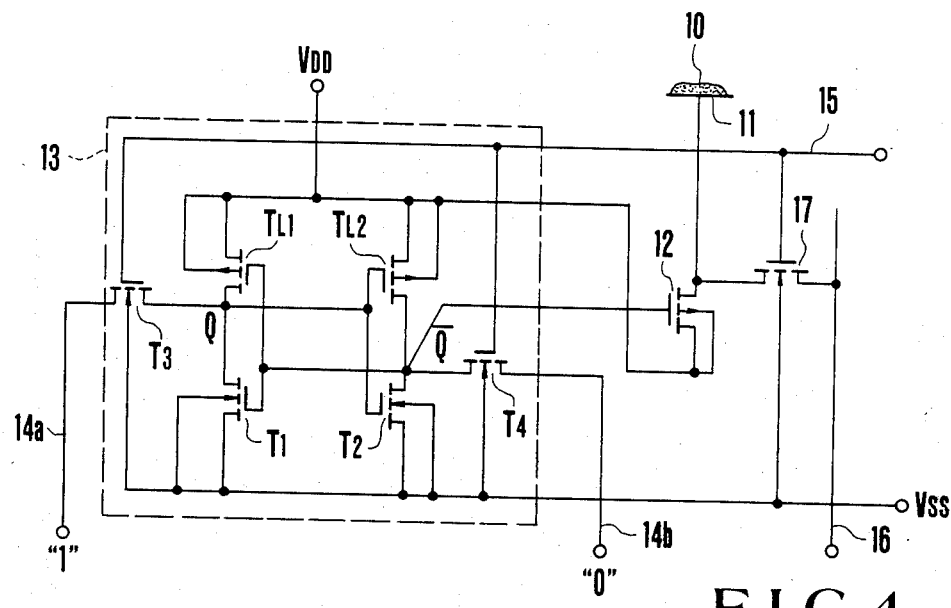
Figure 5:
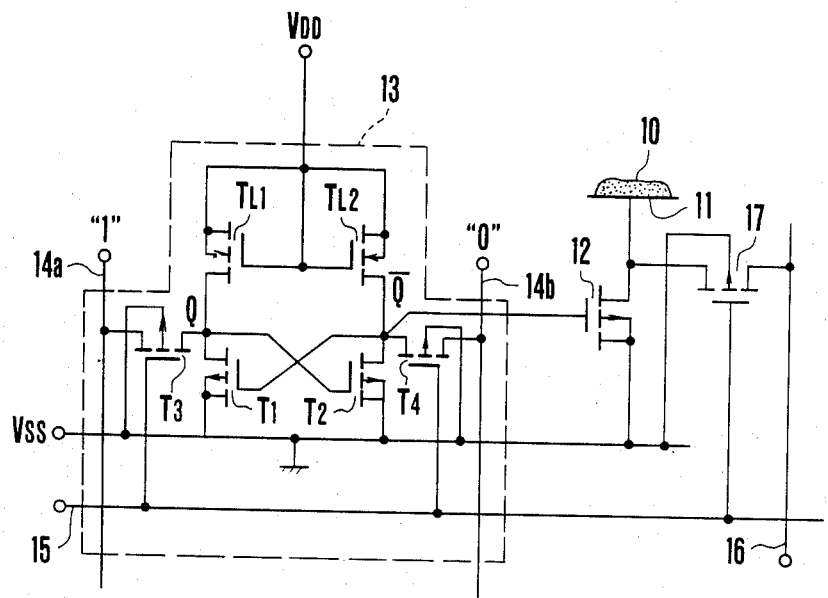

FIG. 4 shows a still another arrangement using a C-MOS substrate as the integrated semiconductor substrate, a P-MOS transistor as a drive transistor 12, and an N-MOS transistor as a read transistor 17. FIG. 5 shows a still another arrangement using a C-MOS substrate as an integrated semiconductor substrate, and P-MOS transistors as drive and read transistors 12 and 17. FIG. 6 shows still another arrangement using a C-MOS substrate as an integrated semiconductor substrate, and N-MOS transistors as drive and read transistors 12 and 17. The same reference numerals used in FIGS. 4 to 6 denote the same parts in FIG. 3, and the basic effects of the arrangements shown in FIGS. 4 to 6 are the same as that of FIG. 3.

In the above description, a C-MOS substrate is used as the integrated semiconductor substrate. However, the present invention is not limited to this type of substrate. For example, a substrate may have bipolar transistors or any other switching elements. In addition, the substrate can comprise any material excluding silicon so as to obtain the same effect as in the embodiment described above.

According to the present invention as described above, the memory comprises a flip-flop S-RAM and a switching transistor is connected to the Q or $\overline{Q}$ output terminal of the flip-flop, thereby obtaining one light-emitting element. A plurality of light-emitting elements are arranged in a matrix form to constitute a light-emitting display section formed together with the drive section on the single semiconductor substrate, thus obtaining a fluorescent display device. This fluorescent display device has a small number of lead wires connected to the display tube and can perform high-luminance display at a low voltage. In addition, when a read transistor is added to the fluorescent display device so as to read out a signal representing the state of the phosphor screen electrode, the integrated semiconductor substrate alone can be tested during the fabrication process to discriminate whether or not it is defective.

What is claimed is:
1. A flourescent display device having:
   an integrated semiconductor substrate formed thereon with a light emitting display section for emitting light from phosphor formed on a screen electrode and a drive section for controlling said light emitting display section; a cathode opposing said light emitting display section; and a vacuum chamber which has at least one light-transmitting surface for forming a display surface and hermetically sealing said semi-conductor substrate and said cathode;
   said light-emitting display section comprising a plurality of light-emitting elements arranged in a matrix form, each of said light emitting elements comprising a static random access memory including a flip-flop which has output terminals Q and $\overline{Q}$, a drive transistor which has a first terminal coupled to one of said output terminals Q and $\overline{Q}$, a second terminal coupled to said screen electrode, and a third terminal coupled to a power source.

2. A device according to claim 1, wherein said integrated semiconductor substrate comprises a complementary metal oxide semiconductor substrate.

3. A device according to claim 2, wherein said drive transistor comprises a p-channel metal oxide semiconductor transistor.

4. A device according to claim 2, wherein said drive transistor comprises an n-channel metal oxide semiconductor transistor.

5. A fluorescent display device having:
- an integrated semi-conductor substrate formed thereon with a light emitting display section for emitting light from a phosphor formed on a screen electrode and a drive section for controlling said light emitting display section;
- a cathode opposing said light emitting display section; and
- a vacuum chamber which has at least one light-transmitting surface for forming a display surface and hermetically sealing said semi-conductor substrate and said cathode;
- said light-emitting display section comprising a plurality of light-emitting elements arranged in a matrix form, two bit lines representative of opposite binary values being commonly connected to each of said light-emitting elements, word selection lines being commonly connected to said light-emitting elements in units of rows of the matrix, and data read lines being commonly connected to a column selector in units of columns of the matrix;
- each of said light-emitting elements comprising a static random access memory including a flip-flop which has output terminals Q and $\overline{Q}$, a drive transistor which has a first terminal coupled to one of the Q and $\overline{Q}$ output terminals of said flip-flop, a second terminal coupled to said screen electrode, and a third terminal coupled to a power source, the conduction between the second and third terminals being controlled by a signal applied to said first terminal; and
- a read transistor having a first terminal connected with a corresponding one of said word selecton lines, a second terminal connected with said corresponding screen electrode, and a third terminal connected with a corresponding one of said data read lines, wherein conduction between said second and third terminals is controlled by a signal applied to said first terminal such that said light-emitting is able to display information supplied from said memory when said corresponding one of said word selection lines is being accessed.

6. A device according to claim 5, wherein said integrated semiconductor substrate comprises a complementary metal oxide semiconductor substrate.

7. A device according to claim 6, wherein said drive transistor comprises a p-channel metal oxide semiconductor substrate and said read transistor comprises an n-channel metal oxide semiconductor transistor.

8. A device according to claim 6, wherein said drive and read transistors comprise p-channel metal oxide semiconductor transistors, respectively.

9. A device according to claim 6, wherein said drive and read transistors comprise n-channel metal oxide semiconductor transistors, respectively.

10. A device according to claim 1 or 6, wherein said integrated semiconductor substrate comprises a substrate having bipolar semiconductor elements.

* * * * *

UNITED STATES PATENT AND TRADEMARK OFFICE
CERTIFICATE OF CORRECTION

PATENT NO. : 4,688,030
DATED : 8/18/87
INVENTOR(S) : Uemura et al.

It is certified that error appears in the above-identified patent and that said Letters Patent is hereby corrected as shown below:

| COLUMN | DESCRIPTION |
|---|---|
| [21] | delete "Appl. No. 844,181" insert --Appl. No. 644,181-- |

Signed and Sealed this

Ninth Day of August, 1988

Attest:

DONALD J. QUIGG

Attesting Officer

Commissioner of Patents and Trademarks